(12) United States Patent
Wang et al.

(10) Patent No.: US 11,031,060 B2
(45) Date of Patent: Jun. 8, 2021

(54) DATA READING CIRCUIT AND STORAGE UNIT

(71) Applicants: Semiconductor Manufacturing International (Shanghai) Corporation, Shanghai (CN); Semiconductor Manufacturing International (Beijing) Corporation, Beijing (CN)

(72) Inventors: Tengye Wang, Shanghai (CN); Tao Wang, Shanghai (CN); Hao Ni, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/864,723

(22) Filed: May 1, 2020

(65) Prior Publication Data
US 2020/0357451 A1    Nov. 12, 2020

(30) Foreign Application Priority Data
May 8, 2019  (CN) .......................... 201910381401.9

(51) Int. Cl.
*G11C 11/16*    (2006.01)
(52) U.S. Cl.
CPC ...... *G11C 11/1673* (2013.01); *G11C 11/1655* (2013.01); *G11C 11/1697* (2013.01)

(58) Field of Classification Search
CPC ............ G11C 11/1673; G11C 11/1655; G11C 11/1697; G11C 5/174; G11C 7/06
See application file for complete search history.

(56) References Cited

U.S. PATENT DOCUMENTS

| | | | |
|---|---|---|---|
| 8,149,627 B2* | 4/2012 | Liao ........................ | G11C 7/02 365/185.21 |
| 2002/0021605 A1* | 2/2002 | Harada .................. | G11C 29/24 365/201 |
| 2016/0379708 A1* | 12/2016 | Katayama ........... | G11C 11/1675 365/148 |

\* cited by examiner

*Primary Examiner* — Han Yang
(74) *Attorney, Agent, or Firm* — Anova Law Group, PLLC

(57) ABSTRACT

A data reading circuit and a storage unit are provided. The data reading circuit includes a being read unit, a reference current generation unit, a current adjustment unit, a reference unit, a comparison unit, and a voltage stabilization unit corresponding to the reference unit. The being read unit is connected to the current adjustment unit and the comparison unit. The reference current generation unit is connected to the current adjustment unit. The current adjustment unit is connected to the reference current generation unit, the being read unit, and the comparison unit. The reference unit is connected to the voltage stabilization unit. The comparison unit is connected to the voltage stabilization unit, the being read unit, and the current adjustment unit. The voltage stabilization unit is connected to the reference unit and the comparison unit.

17 Claims, 2 Drawing Sheets

DATA READING CIRCUIT AND STORAGE UNIT

CROSS-REFERENCES TO RELATED APPLICATIONS

This application claims priority of Chinese Patent Application No. 201910381401.9, filed on May 8, 2019, the entire content of which is hereby incorporated by reference.

FIELD OF THE DISCLOSURE

The present disclosure generally relates to the field of integrated circuit technology and, more particularly, relates to a data reading circuit and a storage unit.

BACKGROUND

A Magnetic Random Access Memory (MRAM) is widely used in various electronic products, and has broad prospects. Represented by a Spin Transfer Torque Magnetic Random Access Memory (STT-MRAM), an MRAM may feature a high read/write speed, a high density, low power consumption, a long data retention time and a long lifetime.

Since an MRAM may have resistance variability, data information may be stored through different resistance states of the MRAM. However, limited by a conventional fabrication process, a ratio of resistance values at a high resistance state and a low resistance state of each cell in an MRAM may be low. Accordingly, a window for distinguishing the high resistance state and the low resistance state during an MRAM reading process may be small.

In a conventional technology, a reference voltage point input to a latched comparator may be connected to a storage array to match a comparison point. Accordingly, data in a storage device may be read according to difference between a reference voltage and a comparison point voltage. However, there may be electric leakage in a circuit, and excessive electric leakage may cause the comparison point voltage to drop rapidly, and thus data may not be correctly read from the MRAM.

The disclosed methods and structures are directed to solve one or more problems set forth above and other problems in the art.

BRIEF SUMMARY OF THE DISCLOSURE

One aspect of the present disclosure includes a data reading circuit. The data reading circuit includes a being read unit, a reference current generation unit, a current adjustment unit, a reference unit, a comparison unit, and a voltage stabilization unit corresponding to the reference unit. The being read unit is connected to the current adjustment unit and the comparison unit, and is configured to store data to be read. The reference current generation unit is connected to the current adjustment unit, and is configured to provide and output a reference current to the current adjustment unit. The current adjustment unit is connected to the reference current generation unit, the being read unit, and the comparison unit, and is configured to adjust a magnitude of the reference current and output an adjusted reference current to the comparison unit. The reference unit is connected to the voltage stabilization unit, and is configured to provide and output a reference voltage to the comparison unit. The comparison unit is connected to the voltage stabilization unit, the being read unit, and the current adjustment unit, and is configured to compare a comparison point voltage with the reference voltage according to the comparison point voltage corresponding to a current of the being read unit and the adjusted reference current, and output a comparison result. The voltage stabilization unit is connected to the reference unit and the comparison unit, and is configured to perform DC separation between the reference unit and the comparison unit and to maintain differential matching between the reference voltage and the comparison point voltage.

Another aspect of the present disclosure includes a storage unit. The storage unit includes a data reading circuit. The data reading circuit includes a being read unit, a reference current generation unit, a current adjustment unit, a reference unit, a comparison unit, and a voltage stabilization unit corresponding to the reference unit. The being read unit is connected to the current adjustment unit and the comparison unit, and is configured to store data to be read. The reference current generation unit is connected to the current adjustment unit, and is configured to provide and output a reference current to the current adjustment unit. The current adjustment unit is connected to the reference current generation unit, the being read unit, and the comparison unit, and is configured to adjust a magnitude of the reference current and output an adjusted reference current to the comparison unit. The reference unit is connected to the voltage stabilization unit, and is configured to provide and output a reference voltage to the comparison unit. The comparison unit is connected to the voltage stabilization unit, the being read unit, and the current adjustment unit, and is configured to compare a comparison point voltage with the reference voltage according to the comparison point voltage corresponding to a current of the being read unit and the adjusted reference current, and output a comparison result. The voltage stabilization unit is connected to the reference unit and the comparison unit, and is configured to perform DC separation between the reference unit and the comparison unit and to maintain differential matching between the reference voltage and the comparison point voltage.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

In a conventional technology, a reference voltage point input to a latched comparator may be connected to a storage array to match a comparison point. Accordingly, data in a storage device may be read according to difference between a reference voltage and a comparison point voltage. However, there may be electric leakage in a circuit, and excessive electric leakage may cause the comparison point voltage to drop rapidly, and thus data may not be correctly read from the MRAM.

Figure 1:
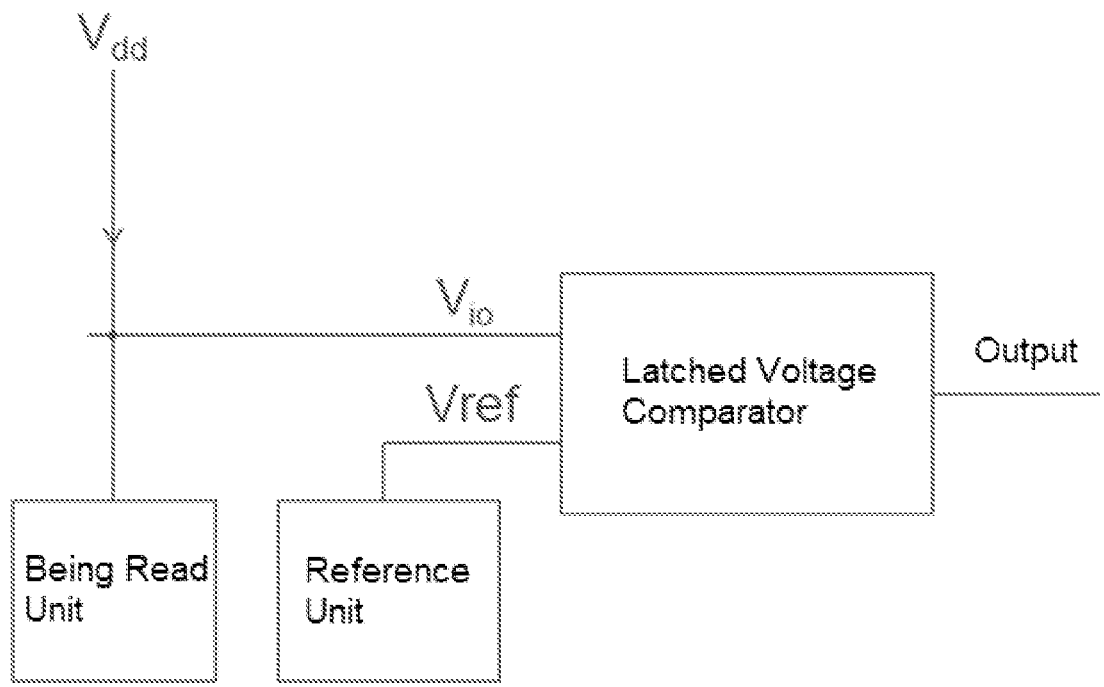
FIG. 1 illustrates a structural diagram of a data reading circuit in a conventional technology.
Figure 2:
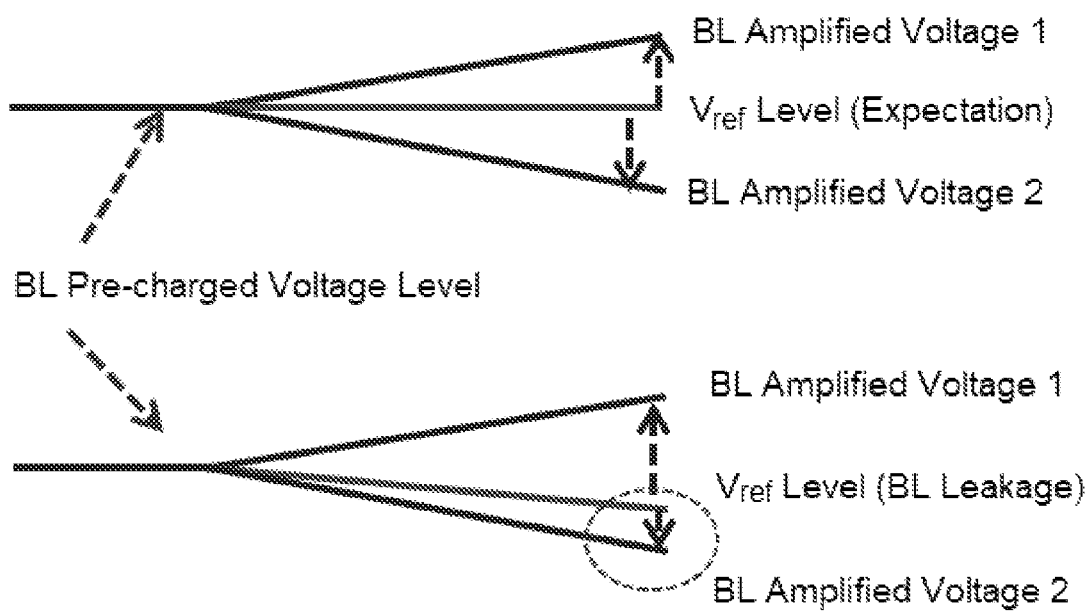
FIG. 2 illustrates a schematic diagram of a bit line voltage level in a conventional technology.

FIG. 1 illustrates a structural diagram of a data reading circuit in a conventional technology. FIG. 2 illustrates a schematic diagram of a bit line voltage level in a conventional technology.

A conventional data reading circuit may include a being read unit, a reference unit, and a latched voltage comparator. As shown in FIG. 1, $V_{dd}$ is a power supply voltage. An input terminal of the latched voltage comparator is a voltage comparison point $V_{io}$, and another input terminal of the latched voltage comparator is directly connected to the reference unit. When there is an electric leakage, a reference voltage $V_{ref}$ may drop. As shown in FIG. 2, a decrease of $V_{ref}$ caused by electric leakage of a bit line BL may make the $V_{ref}$ to fall below an expected level. After the bit line BL is pre-charged, difference between the $V_{ref}$ and an amplified voltage 2 of the bit line BL may be reduced, and difference between the $V_{ref}$ and an amplified voltage 1 of the bit line BL may be enlarged. As such, data reading may be incorrect.

In addition, when data reading is performed by using the above-mentioned conventional data reading circuit, the reference voltage $V_{ref}$ may drift and there may be noise in an array of the being read unit. In this case, the voltage comparison point $V_{io}$ may be affected by the noise, while the $V_{ref}$ may not be affected. At this time, difference between $V_{io}$ and $V_{ref}$, that is, a judgment window for data reading, may be reduced correspondingly, resulting in a data reading error.

In the present disclosure, a voltage stabilization unit is added between a comparison unit and a reference unit. Accordingly, a limitation of a conventional technology by an idea that the comparison unit and the reference unit are directly connected to an array to achieve perfect matching for noise and loading, may be avoided. By adding the voltage stabilization unit, direct current (DC) separation may be achieved, and differential matching between the reference voltage and the comparison point voltage may be maintained. Accordingly, an effect on a data reading process due to electric leakage may be avoided. In addition, a reference current may be adjusted by a current adjustment unit, such that the reference current may meet requirements for a reference current in a trend of electric leakage, and thus a reading margin may be improved.

Figure 3:
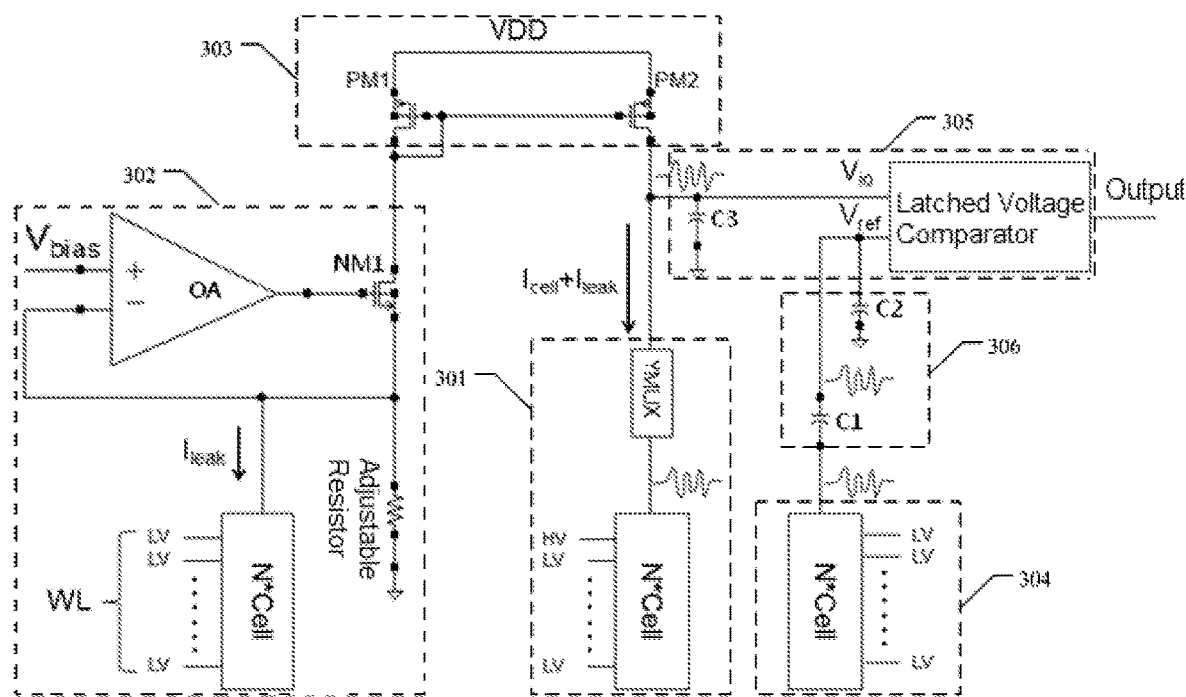
FIG. 3 illustrates a structural diagram of an exemplary data reading circuit consistent with the disclosed embodiments of the present disclosure.

The present disclosure provides a data reading circuit. FIG. 3 illustrates a structural diagram of an exemplary data reading circuit consistent with the disclosed embodiments of the present disclosure. As shown in FIG. 3, the data reading circuit includes a being read unit 301, a reference current generation unit 302, a current adjustment unit 303, a reference unit 304, a comparison unit 305, and a voltage stabilization unit 306 corresponding to the reference unit 304.

The being read unit 301 is connected to an output terminal of the current adjustment unit 303 and an input terminal of the comparison unit 305. The being read unit 301 may be configured to store data to be read.

The reference current generation unit 302 is connected to an input terminal of the current adjustment unit 303. The reference current generation unit 302 may be configured to provide and output a reference current to the current adjustment unit 303.

The current adjustment unit 303 is connected to an output terminal of the reference current generation unit 302, an input terminal of the being read unit 301, and an input terminal of the comparison unit 305. The current adjustment unit 303 may be configured to adjust a magnitude of a reference current and output an adjusted reference current to the comparison unit 305.

The reference unit 304 is connected to an input terminal of the voltage stabilization unit 306. The reference unit 304 may be configured to provide and output a reference voltage $V_{ref}$ to the comparison unit 305.

The comparison unit 305 is connected to an output terminal of the voltage stabilization unit 306, an input terminal of the being read unit 301, and an output terminal of the current adjustment unit 303. The comparison unit 305 may be configured to compare the comparison point voltage $V_{io}$ with the reference voltage $V_{ref}$ according to the comparison point voltage $V_{io}$ corresponding to a current of the being read unit 301 and the adjusted reference current, and output a comparison result.

The voltage stabilization unit 306 is connected to an output terminal of the reference unit 304 and an input terminal of the comparison unit 305. The voltage stabilization unit 306 may be configured to perform DC separation between the reference unit 304 and the comparison unit 305, and to maintain differential matching between the reference voltage $V_{ref}$ and the comparison point voltage $V_{io}$.

In one embodiment, the voltage stabilization unit 306 may include a DC voltage stabilization capacitor C2 and an AC noise coupling capacitor C1. A first terminal of the DC voltage stabilization capacitor C2 is connected to the reference voltage input terminal of the comparison unit 305 and the AC noise coupling capacitor C1. The second terminal of the DC voltage stabilization capacitor C2 is grounded. A first terminal of the AC noise coupling capacitor C1 is connected to the reference voltage input terminal $V_{ref}$ of the comparison unit 306 and the first terminal of the DC voltage stabilization capacitor, and a second terminal of the AC noise coupling capacitor C1 is connected to the reference unit 304.

In practical applications, the first terminal of the DC voltage stabilization capacitor C2 may be connected to the reference voltage input terminal of the comparison unit 305. The DC voltage stabilization capacitor C2 may simulate the bit line load at the signal input point and realize a good differential match between the comparison point voltage $V_{io}$ and the reference voltage $V_{ref}$. The second terminal of the AC noise coupling capacitor C1 may be coupled to the bit line of the reference unit 304, such that an electric leakage problem caused by directly connecting the comparison unit 305 and the reference unit 304 may be avoided. As such, combination of C1 and C2 may make the two input terminals of the comparison unit 305 achieve better differential input matching, and data may thus be read correctly.

In one embodiment, the current adjustment unit 303 may be configured to mirror a preset proportion of the reference current to the being read unit 301 as a load of the being read unit 301, and convert a cell current $I_{cell}$ of the being read unit into a voltage signal.

In one embodiment, the reference current generation unit 302 may further include a voltage stabilization circuit, such that a reference current may be generated, and the bit line voltage of the reference current generation unit 303 may be controlled.

In one embodiment, the reference current generation unit 302 may include an adjustable resistor and a bit line leakage compensation path that are connected in parallel. A first terminal of the adjustable resistor is connected in parallel with the bit line leakage compensation path, and a second terminal of the adjustable resistor is grounded. The bit line leakage compensation path includes a third data storage array. Word lines WL of the third data storage array connected to the bit lines on the bit line leakage compensation path are all off.

In practical applications, the third data storage array may include N cells (N*Cell) with a preset third position in a data storage device, such as an MRAM. The word lines WL corresponding to the third data storage array are off, that is, the corresponding word lines WL are connected to a low voltage LV.

The reference current generation unit 302 may perform a current compensation Leak similar to an environment of the being read unit 301 on the reference current, such that the being read unit 301 may be read correctly. It may be understood that, on condition that the reference current provided by the reference current generation unit 302 may reflect the electric leakage trend in real time, the present disclosure does not limit combinations of the array in the reference current generation unit 302.

In one embodiment, the reference current generation unit 302 may also include an operational amplifier OA and a first NMOS transistor NM1. In the operational amplifier OA, a non-inverting input terminal is connected to an external bias voltage $V_{bias}$, and an inverting input terminal is connected to the third data storage array, a first terminal of the adjustable resistor and a drain of the first NMOS transistor NM1. An output terminal of the operational amplifier OA is connected to a gate of the first NMOS transistor NM1. A source of the first NMOS transistor NM1 is connected to the current adjustment unit 303. The operational amplifier OA and the first NMOS transistor NM1 may form a voltage stabilization circuit to control the bit line voltage level of the reference current generation unit 303.

In practical applications, the current adjustment unit 303 may amplify or reduce the reference current by a certain proportion, such that the reference current may be flexibly adjusted to meet requirements of a change of the reference current under a trend of electric leakage.

In one embodiment, the current adjustment unit 303 may include a first PMOS transistor PM1 and a second PMOS transistor PM2. The first PMOS transistor PM1 and the second PMOS transistor PM2 may amplify or reduce the reference current by a certain proportion. In the first PMOS transistor PM1, a gate is connected to a drain of the first PMOS transistor PM1, the reference current generation unit 302, and a gate of the second PMOS transistor PM2, and a source is connected to a source of the second PMOS transistor PM2. In the second PMOS transistor PM2, a drain is connected to the comparison unit 305 and the being read unit 301.

In one embodiment, the being read unit 301 may include a data storage device and a bit line selector YMUX that are connected in serial. One terminal of the bit line selector YMUX is connected to the data storage device, and the other terminal of the bit line selector YMUX is connected to the comparison unit 305 and the current adjustment unit 303.

The data storage device may include N cells (N*Cell) in a data storage device such as an MRAM. In a reading cycle, a word line corresponding to the data storage device may be connected to a high voltage HV, and (N−1) word lines corresponding to the data storage device may be connected to a low voltage LV.

In one embodiment, the comparison unit 305 may include at least one latched voltage comparator. According to the comparison point voltage $V_{io}$ corresponding to the current of the being read unit 301 and the adjusted reference current, the comparison unit 305 may compare the comparison point voltage $V_{io}$ with the reference voltage $V_{ref}$ and finally output a comparison result. The present disclosure does not limit a type and data of a comparator in the comparison unit 305.

In one embodiment, the comparison unit 305 may include a first capacitor C3. A terminal of the first capacitor C3 is connected to the input terminal of the comparison point voltage $V_{io}$ of the comparison unit 305, and a second terminal of the first capacitor C3 is grounded.

In one embodiment, the reference unit 304 may include a first data storage array. The first data storage array may include N cells (N*Cell) with a preset first position in a data storage device, such as an MRAM. Word lines corresponding to the first data storage array are off, that is, the corresponding word lines are connected to a low voltage LV.

Figure 4:
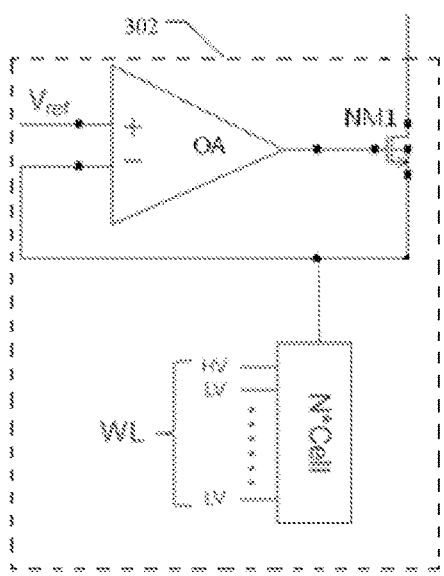
FIG. 4 illustrates a circuit structural diagram of another exemplary reference current generation unit consistent with the disclosed embodiments of the present disclosure.

FIG. 4 illustrates a circuit structural diagram of another reference current generation unit consistent with the disclosed embodiments of the present disclosure.

In one embodiment, the reference current generation unit 302 may include a second data storage array corresponding to the first data storage array. The second data storage array may include N cells (N*Cell) with a preset second position in a data storage device, such as an MRAM. In addition, in a reading cycle, a word line corresponding to the second data storage array may be connected to a high voltage HV, and (N−1) word lines corresponding to the second data storage array may be connected to a low voltage LV.

In one embodiment, the reference current generation unit 302 may include an operational amplifier OA, a first NMOS transistor NM1, and the second data storage array. In the operational amplifier OA, a non-inverting input terminal is connected to an external bias voltage $V_{bias}$, and an inverting input terminal is connected to the second data storage array and a drain of the first NMOS transistor NM1. An output terminal of the operational amplifier OA is connected to a gate of the first NMOS transistor NM1. A source of the first NMOS transistor NM1 is connected to the current adjustment unit 303. The operational amplifier OA and the first NMOS transistor NM1 may form a voltage stabilization circuit to control the bit line voltage level of the reference current generation unit 303.

In practical applications, the second data storage array in the reference current generation unit 302 corresponds to the first data storage array in the reference unit 304. The reference current generation unit 302 may use a combination of the data storage array of the reference unit 304, and may thus fully simulate the electric leakage trend of the bit lines in the reference unit 304. Accordingly, a problem that data may not be read correctly due to differential mismatch between the comparison point voltage $V_{io}$ and the reference voltage $V_{ref}$ may be avoided.

In the present disclosure, the first data storage array, the second data storage array, and the third data storage array are storage cells (Cells) at different locations of a data storage device.

In the present disclosure, substrates of all the PMOS transistors are connected to a power source VDD, and substrates of all the NMOS transistors are grounded.

In practical applications, a resistance ratio of a high-resistance state and a low-resistance state of an MRAM may be low, and a reading voltage of bit lines of the MRAM may also be low. By using the data reading circuit provided by the present disclosure, a margin for judging a state of the data storage device may be improved. As such, the data reading circuit provided by the present disclosure may improve a reading margin for a data storage device with a low resistance ratio of the high-resistance state and the low-resistance state, or a low bit line reading voltage, or both a low bit line reading voltage and a low resistance ratio of the high-resistance state and the low-resistance state.

In practical applications, the two input terminals of the latched voltage comparator and the bit lines of the being read unit 301 may be pre-charged to a certain level. Then, the bit line voltage signal may be amplified, and the voltage comparison point $V_{io}$ may change with a data size of the being read unit 301. At this time, the reference voltage $V_{ref}$ may remain stable. After the differential signal between the two input terminals of the latched voltage comparator satisfies a certain margin, the latched voltage comparator may be activated to complete data latching. It may be understood that, according to various needs, a user may select the above working sequence or set other working sequences. The present disclosure does not limit working sequences.

In summary, in the present disclosure, the voltage stabilization unit 306 is added between the comparison unit 305 and the reference unit 304. Accordingly, a limitation of a conventional technology by an idea that the comparison unit and the reference unit are directly connected to an array to achieve perfect matching for noise and loading, may be avoided. By adding the voltage stabilization unit, direct current (DC) separation may be achieved, and differential matching between the reference voltage and the comparison point voltage may be maintained. Accordingly, an effect on a data reading process due to electric leakage may be avoided. In addition, the reference current may be adjusted by the current adjustment unit, such that the reference current may meet requirements for the reference current in a trend of electric leakage, and thus a reading margin may be improved.

The present disclosure also provides a storage unit. The storage unit includes any one of the data reading circuits provided by the present disclosure.

As disclosed, the technical solutions of the present disclosure have the following advantages.

A voltage stabilization unit is added between a comparison unit and a reference unit. Accordingly, a limitation of a conventional technology by an idea that the comparison unit and the reference unit are directly connected to an array to achieve perfect matching for noise and loading, may be avoided. By adding the voltage stabilization unit, direct current (DC) separation may be achieved, and differential matching between the reference voltage and the comparison point voltage may be maintained. Accordingly, an effect on a data reading process due to electric leakage may be avoided. In addition, a reference current may be adjusted by a current adjustment unit, such that the reference current may meet requirements for a reference current in a trend of electric leakage, and thus a reading margin may be improved.

Further, the reference current generation unit includes an adjustable resistor and a bit line leakage compensation path that are connected in parallel. Current compensation similar to an environment of the being read unit may be performed on the reference current, such that the being read unit may be read correctly.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A data reading circuit, comprising a being read unit, a reference current generation unit, a current adjustment unit, a reference unit, a comparison unit, and a voltage stabilization unit corresponding to the reference unit, wherein:
   the being read unit includes a data storage device and is connected to the current adjustment unit and the comparison unit, and is configured to store data to be read;
   the reference current generation unit is connected to the current adjustment unit, and is configured to provide and output a reference current to the current adjustment unit;
   the current adjustment unit is connected to the reference current generation unit, the being read unit, and the comparison unit, and is configured to adjust a magnitude of the reference current and output an adjusted reference current to the comparison unit;
   the reference unit is connected to the voltage stabilization unit, and is configured to provide and output a reference voltage to the comparison unit;
   the comparison unit is connected to the voltage stabilization unit, the being read unit, and the current adjustment unit, and is configured to compare a comparison point voltage with the reference voltage according to the comparison point voltage corresponding to a current of the being read unit and the adjusted reference current, and output a comparison result; and
   the voltage stabilization unit is connected to the reference unit and the comparison unit, and is configured to perform direct current (DC) separation between the reference unit and the comparison unit and to maintain differential matching between the reference voltage and the comparison point voltage.

2. The circuit according to claim 1, wherein the reference unit includes a first data storage array, wherein:
   the first data storage array includes cells with a preset first position in a data storage device; and
   word lines corresponding to the first data storage array are shut off.

3. The circuit according to claim 2, wherein the reference current generation unit includes a second data storage array corresponding to the first data storage array, wherein:
   the second data storage array includes cells with a preset second position in a data storage device.

4. The circuit according to claim 3, wherein, in a reading cycle, a word line corresponding to the second data storage array is connected to a high voltage.

5. The circuit according to claim 1, wherein the voltage stabilization unit includes a DC voltage stabilization capacitor and an alternating current (AC) noise coupling capacitor, wherein:
   a first terminal of the DC voltage stabilization capacitor is connected to a reference voltage input terminal of the comparison unit and the AC noise coupling capacitor, and a second terminal of the DC voltage stabilization capacitor is grounded; and a first terminal of the AC noise coupling capacitor is connected to the reference voltage input terminal of the comparison unit and the first terminal of the DC voltage stabilization capacitor, and a second terminal of the AC noise coupling capacitor is connected to the reference unit.

6. The circuit according to claim 1, wherein the current adjustment unit is configured to mirror a preset proportion of the reference current to the being read unit.

7. The circuit according to claim 1, wherein the reference current generation unit is further configured to control a bit line voltage of the reference current generation unit.

8. The circuit according to claim 1, wherein the reference current generation unit includes an operational amplifier, a first NMOS transistor, and a second data storage array, wherein:

in the operational amplifier, a non-inverting input terminal is connected to an external bias voltage, an inverting input terminal is connected to the second data storage array and a drain of the first NMOS transistor, and an output terminal is connected to a gate of the first NMOS transistor;

a source of the first NMOS transistor is connected to the current adjustment unit; and the second data storage array includes cells with a preset second position in a data storage device.

9. The circuit according to claim 8, wherein the second data storage array in the reference current generation unit corresponds to the first data storage array in the reference unit.

10. The circuit according to claim 1, wherein the reference current generation unit includes an adjustable resistor and a bit line leakage compensation path that are connected in parallel, wherein:

a first terminal of the adjustable resistor is connected in parallel to the bit line leakage compensation path, and a second terminal of the adjustable resistor is grounded; and the bit line leakage compensation path includes a third data storage array, wherein:

the third data storage array includes cells with a preset third position in a data storage device; and word lines of the third data storage array connected to bit lines on the bit line leakage compensation path are all shut off.

11. The circuit according to claim 10, wherein the reference current generation unit also includes an operational amplifier and a first NMOS transistor, wherein:

in the operational amplifier, a non-inverting input terminal is connected to an external bias voltage, an inverting input terminal is connected to the third data storage array, the first terminal of the adjustable resistor and a drain of the first NMOS transistor, and an output terminal is connected to a gate of the first NMOS transistor; and a source of the first NMOS transistor is connected to the current adjustment unit.

12. The circuit according to claim 1, wherein the current adjustment unit includes a first PMOS transistor and a second PMOS transistor, wherein:

in the first PMOS transistor, a gate is connected to a drain of the first PMOS transistor, the reference current generation unit, and a gate of the second PMOS transistor, and a source is connected to a source of the second PMOS transistor; and in the second PMOS transistor, a drain is connected to the comparison unit and the being read unit.

13. The circuit according to claim 1, wherein the being read unit further includes a bit line selector that are connected in serial, wherein:

a terminal of the bit line selector is connected to the data storage device, and another terminal of the bit line selector is connected to the comparison unit and the current adjustment unit.

14. The circuit according to claim 13, wherein, in a reading cycle, a word line corresponding to the data storage device is connected to a high voltage.

15. The circuit according to claim 1, wherein the comparison unit includes at least one latched voltage comparator.

16. The circuit according to claim 1, wherein the comparison unit includes a first capacitor, wherein:

a first terminal of the first capacitor is connected to an input terminal of the comparison point voltage of the comparison unit, and a second terminal of the first capacitor is grounded.

17. A storage unit, including a data reading circuit, wherein the data reading circuit includes a being read unit, a reference current generation unit, a current adjustment unit, a reference unit, a comparison unit, and a voltage stabilization unit corresponding to the reference unit, wherein:

the being read unit includes a data storage device and is connected to the current adjustment unit and the comparison unit, and is configured to store data to be read;

the reference current generation unit is connected to the current adjustment unit, and is configured to provide and output a reference current to the current adjustment unit;

the current adjustment unit is connected to the reference current generation unit, the being read unit, and the comparison unit, and is configured to adjust a magnitude of the reference current and output an adjusted reference current to the comparison unit;

the reference unit is connected to the voltage stabilization unit, and is configured to provide and output a reference voltage to the comparison unit;

the comparison unit is connected to the voltage stabilization unit, the being read unit, and the current adjustment unit, and is configured to compare a comparison point voltage with the reference voltage according to the comparison point voltage corresponding to a current of the being read unit and the adjusted reference current, and output a comparison result; and the voltage stabilization unit is connected to the reference unit and the comparison unit, and is configured to perform direct current (DC) separation between the reference unit and the comparison unit and to maintain differential matching between the reference voltage and the comparison point voltage.

\* \* \* \* \*